(12) United States Patent
Kumagai

(10) Patent No.: US 6,501,321 B2
(45) Date of Patent: Dec. 31, 2002

(54) LEVEL SHIFT CIRCUIT

(75) Inventor: Naoki Kumagai, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/971,457

(22) Filed: Oct. 5, 2001

(65) Prior Publication Data

US 2002/0014905 A1 Feb. 7, 2002

Related U.S. Application Data

(62) Division of application No. 09/517,154, filed on Mar. 2, 2000, now Pat. No. 6,326,831.

(30) Foreign Application Priority Data

Mar. 2, 1999 (JP) ............................................. 11-053484

(51) Int. Cl.[7] .............................................. H03L 5/00
(52) U.S. Cl. ..................................................... 327/333
(58) Field of Search ...................... 326/80, 81; 327/108, 327/109, 110, 111, 112, 319, 333

(56) References Cited

U.S. PATENT DOCUMENTS

| | | | |
|---|---|---|---|
| 4,942,309 A | | 7/1990 | Chieli .......................... 307/270 |
| 5,105,099 A | * | 4/1992 | Routh et al. ................... 326/33 |
| 5,134,322 A | * | 7/1992 | Bourgeois et al. ........... 327/381 |
| 5,510,943 A | | 4/1996 | Fukunaga .................... 361/18 |
| 5,552,731 A | | 9/1996 | Diazzi et al. ................ 327/109 |
| 5,572,156 A | | 11/1996 | Diazzi et al. ................ 327/109 |
| 5,742,196 A | | 4/1998 | Fronen et al. ............... 327/382 |
| 5,747,943 A | | 5/1998 | Houk et al. .................. 315/225 |

FOREIGN PATENT DOCUMENTS

| | | |
|---|---|---|
| DE | 196 36 753 A1 | 7/1997 |
| GB | 2244400 A | 11/1991 |

* cited by examiner

Primary Examiner—Jeffrey Zweizig
(74) Attorney, Agent, or Firm—Rossi & Associates

(57) ABSTRACT

A level shift circuit applies an on signal 25 and an off signal 26 each consisting of pulses, to high-voltage MOSFETs 1, 2, respectively, having their source connected to a common potential COM to induce a voltage drop in load resistors 3, 4 in order to set or reset a RS latch 15 to turn on or off an IGBT 17 on an upper arm of a PWM inverter bridge circuit having a varying emitter potential, a circuit free from a long time delay prevents an increase dV/dt in potential of an AC output terminal OUT that results in charging of a capacity between a source and a drain of each of the high-voltage MOSFETs 1, 2, whereby the charge current induces a voltage drop in the resistors 3, 4 to cause the RS latch to malfunction. NOT circuits 8, 11 and a NOR circuit 13 transmit a regular on signal, while NOT circuits 9, 12 and a NOR circuit 14 transmit a regular off signal. A threshold for the NOT circuits 8, 9 is lower than that for the NOT circuits 7, 10, so that when a voltage drop simultaneously occurs in the resistors 3, 4, output pulses from the NOT circuits 7, 10 mask output pulses from the NOT circuits 8, 9.

2 Claims, 4 Drawing Sheets

LEVEL SHIFT CIRCUIT

This is a Division of application Ser. No. 09/517,154 filed Mar. 2, 2000, now U.S. Pat. No. 6,326,831.

FIELD OF THE INVENTION

The present invention relates to a level shift circuit for use in communicating, without potential insulation, on/off signals from a circuit connected to a common potential such as a ground to a control electrode of a controllable semiconductor device such as a semiconductor switching device on an upper arm of a power-inverting bridge circuit, for example, in a PWM inverter or a switching power supply, the controllable semiconductor device having an electrode (an emitter or a source) that acts as a potential reference for an input control drive signal and that has a potential varying relative to the common potential. Desirably, the present invention relates to a level shift circuit for use in the form of an HVIC (high-voltage IC).

BACKGROUND ART

In the interest of cost reduction, level shift circuits free from potential insulation provided be a transformer or a photocoupler have recently been used as circuits for turning on and off a semiconductor switching device constituting an upper arm of a power-inverting (i.e., conversion of a direct current into an alternate current) bridge circuit such as a PWM inverter.

FIG. 7 shows an example configuration of a conventional level shift circuit of this kind. In this FIG., 17 and 18 are output IGBTs connected in series between a main DC power supply Vdc (a positive-electrode side) for a high voltage, for example, 400 V and a common potential COM located at a negative-electrode side of this power supply, in order to form, for example, one phase of a power-inverting bridge circuit of a PWM inverter.

OUT denotes a connection point between an emitter of the upper-arm IGBT 17 of the bridge circuit and the lower-arm IGBT 18 thereof; that is, this is an output terminal for AC power generated by alternately turning on and off the IGBTs 17 and 18.

E2 denotes, for example, a 15-V auxiliary DC power supply (also referred to as a "driver power supply") having a negative electrode connected to the common potential COM, and 20 is a driver for turning on and off the lower-arm IGBT 18 and which operates under the auxiliary DC power supply E2.

The remaining part of the circuit constitutes a level shift circuit for driving the upper-arm IGBT 17 of the bridge circuit. That is, reference numeral 1 designates a high-voltage MOSFET for inputting and conducting an on signal 25 consisting of pulses generated by a circuit (not shown) so that the resulting voltage drop in a load resistor 3 is used as a signal to turn on the IGBT 17. Reference numeral 2 designates a high-voltage MOSFET for inputting and conducting an off signal 26 consisting of pulses generated by a circuit (not shown) so that the resulting voltage drop in a load resistor 4 is used as a signal to turn off the IGBT 17.

Normally, the high-voltage MOSFETs 1 and 2 are configured to be equal to each other, as are the load resistors 3 and 4. Constant-voltage diodes 5, 6 connected in parallel to the load resistors 3, 4, respectively, limit any excessive voltage drop in the load resistors 3, 4 to protect NOT circuits 8, 9 or the like, which will be described below.

In the level shift circuit, the two MOSFETs 1 and 2 constitute a circuit section for inputting a signal based on the stationary common potential COM. On the other hand, the portion of the circuit enclosed by the broken line in the figure indicates a circuit section with a varying potential which operates based on the potential of the AC output terminal OUT that alternately follows the common potential COM and the potential Vdc of the main DC power supply depending on whether the IGBTs 17, 18 are turned on or off.

E1 in the circuit enclosed by the broken line denotes, for example, a 15-V auxiliary DC power supply (also referred to as a "driver power supply") having a positive electrode connected to a line Vcc1 and a negative electrode connected to the AC output terminal OUT. The NOT circuits 8, 9 and subsequent circuits [consisting of low-pass filter circuits (also simply referred to as "LPFs") 30, 31, a RS flip flop (a RS latch also simply referred to as an "RS-FF") 15, a driver 16, etc.] operate using the auxiliary DC power supply E1 as a power supply.

However, a power supply voltage for a load resistor circuit for the high-voltage MOSFETs 1 and 2 which comprises the load resistors 3, 4 with their upper ends connected to the positive-electrode line Vcc1 of the auxiliary DC power supply E1 varies between a maximum value (E1+Vdc) and a minimum value E1 because the potential of the output terminal OUT varies between the common potential COM and the DC power supply potential Vdc.

Actually, however, a free wheel diode (not shown) is connected in parallel to each of the IGBTs 17, 18 in such a manner that its cathode is located on a collector side. Thus, when the free wheel diodes are in an ON-state, the potential of the output terminal OUT may have a negative value of several V relative to the common potential COM.

Next, operation of this level shift circuit will be described. The on signal 25 is applied to a gate of the MOSFET 1 to cause a current to flow through the MOSFET 1 to induce a voltage drop in the load resistor 3. When the potential at a lower end of the load resistor 3 becomes smaller than a threshold for the NOT circuit 8, an output from the NOT circuit 8 is set to the Hi level.

This Hi level is applied to a set terminal S of the RS latch 15 via the LPF 30 to set an output Q from the RS latch 15 to the Hi level, thereby turning the output IGBT 17 on via the driver 16. At the same time (strictly speaking, for prevention of a possible inter-arm short circuit, slightly before the point of turn-on), the IGBT 18 is turned off via a circuit (not shown) including the driver 20.

Next, the off signal 26 is applied to a gate of the MOSFET 2 to cause a current to flow through the MOSFET 2 to induce a voltage drop in the load resistor 4. When the potential at a lower end of the load resistor 4 becomes smaller than a threshold for the NOT circuit 9, an output from the NOT circuit 9 is set to the Hi level.

This Hi level is applied to a reset terminal R of the RS latch 15 via the LPF 31 to set the output Q from the RS latch 15 to a Lo level, thereby turning the output IGBT 17 off via the driver 16. At the same time (strictly speaking, for prevention of a possible inter-arm short circuit, slightly after the point of turn-off), the IGBT 18 is turned on via the circuit (not shown) including the driver 20.

When the output IGBT 18 is turned off or the IGBT 17 is turned on, this switching causes a rapid increase in potential dV/dt at the output terminal OUT to charge a capacitance between a source and a drain of each of the MOSFETs 1 and 2.

This charge current may induce a voltage drop in the load resistors 3 and 4 which is different from the true on and off signals, thereby causing the RS latch 15 to malfunction, mistakenly turning on the IGBT 17 to cause an inter-arm short circuit in the bridge circuit, or unnecessarily turning off the IGBT 17.

In addition to switching of the IGBTs 17, 18, extraneous noise may induce a similar abnormal voltage drop in the load resistors 3, 4.

The low-pass filters (LPF) 30 and 31 are inserted to prevent such malfunctioning of the RS latch 15 in order to remove, as abnormal signals, input signals of a small pulse width (a high frequency) resulting from switching or extraneous noise.

The reason why the on/off pulse signals 25, 26 are used to turn on and off the output IGBT 17 as in the circuit in FIG. 7 will be described below. In order to reduce harmonics components of an AC output from a PWM inverter or the like at low cost, it is desirable to increase a carrier frequency at which an output switching device is turned on and off and thus to operate the level shift circuit at a high speed.

To operate the level shift circuit at a high speed, a relatively high current must flow through the high-voltage MOSFETs 1, 2 for a level shift circuit. In particular, if a circuit section with a varying potential such as one shown by the broken line in FIG. 7 has a high potential, losses caused by the above current increase.

If, for example, a 10-mA current flows through the high-voltage MOSFET, the main DC power supply Vdc provides a voltage of 400 V, and the signal for turning on the high-voltage MOSFET is a signal that does not consist of pulses (in this case, only one MOSFET is used), then the average of losses on the high-voltage MOSFET occurring while the collector potential is high has a large value of about 2 W if the high-voltage MOSFET has an average on/off duty cycle of 50%.

Thus, the average loss on the high-voltage MOSFET is reduced by decomposing a current through the high-voltage MOSFET into pulses for turning the output IGBT on and pulses for turning the output IGBT off (in this case, two MOSFETs are used for turning the IGBT on and off) and minimizing the duration of these pulses.

Another reset input R of the RS latch 15 (the reset terminal 21 is connected to the RS latch 15) is used for resetting the RS latch 15 in an initial state or turning off the IGBT 17 when an error occurs.

If a level shift circuit such as one described above has high frequency signal components that may cause malfunctioning associated with dV/dt at the AC output terminal OUT, the components can be removed by the low-pass filters 30, 31. Low frequency components, however, are difficult to remove.

Consequently, with a large dV/dt, the time required by the AC output terminal OUT to reach the voltage $V_{DC}$ of the main DC power supply is short enough to prevent malfunctioning. With a small dV/dt, however, this time is long enough to cause malfunctioning.

To prevent this, the cutoff frequency of the low-pass filter can be reduced, but a problem of this method is that the reduction may increase a time delay in the level shift or require the width of on/off pulses to be increased, thereby increasing losses on the level shift circuit.

Another problem is that the value of a current resulting from on/off pulses must be increased due to the degraded constant-current characteristic of the high-voltage MOSFETs 1, 2 for the conventional level shift circuit. This will be described below.

FIG. 8 shows the relationship between the characteristics of a voltage $V_{DS}$ between a source and a drain (horizontal axis) of the high-voltage MOSFETs 1, 2 for a level shift circuit and the characteristics of a drain current $I_D$ (vertical axis) thereof, which is called the $V_{DS}$–$I_D$ characteristic. This FIG. shows that the high-voltage MOSFET generally has a degraded constant-current characteristic due to resistance in a drift area ($V_{DS}$ maintains a large value until $I_D$ increases up to a constant value $I_H$).

Accordingly, if the circuit section with a varying potential has a low potential, that is, the AC output terminal OUT has a potential close to the common potential COM [FIG. 8 shows a case where the terminal OUT has a potential equal to the common potential COM and where the power supply voltage for the load resistor circuit for the MOSFETs 1, 2 (that is, the voltage E1 of the power supply line Vcc1 with the load resistors 3, 4 connected thereto) is set equal to the voltage of the auxiliary DC power supply E1], a drain current $I_L$ flows which is determined by a load line 32 of the load resistor 3 or 4.

The load resistor 3 or 4 is set to have such a value as to sufficiently invert the output from the NOT circuit 8 or 9 due to a voltage drop caused by this current $I_L$.

On the other hand, if the circuit section with a varying potential has a high potential, that is, the AC output terminal OUT has a potential close to the main-power-supply voltage Vdc [FIG. 8 shows a case where the terminal OUT has a potential equal to the main-power-supply voltage Vdc and where the voltage of the power supply line Vcc1 is set equal to (Vdc+E1)], a drain current IH flows which is determined by a load line 33 of the load resistor 3 or 4.

The drain current $I_H$ has a larger value than the current $I_L$, thereby increasing losses on the level shift circuit.

It is thus an object of the present invention to provide a level shift circuit that meets a first object of preventing malfunctioning, regardless of the magnitude of dV/dt at the AC output terminal OUT, caused by switching of semiconductor switching devices in an inverter bridge circuit or by extraneous noise and without causing a time delay in the level shift circuit or increasing the width of on/off pulses, the level shift circuit also meeting a second object of preventing an increase on losses on the level circuit caused by the degraded constant-current characteristic of the high-voltage MOSFET.

SUMMARY OF THE INVENTION

To attain the above object, the present invention provides a level shift circuit comprising a first and a second controllable semiconductor devices each having an electrode acting as a potential reference and connected to a common potential, the potential reference electrode and a main electrode being electrically connected together while a conduction signal is being input between the potential reference electrode and a control electrode; a DC power supply having one electrode connected to an external circuit at a predetermined site varying between the common potential and a predetermined high potential and having a voltage lower than a voltage between the two potentials; a first and a second load resistors each having one end connected to the other electrode of the DC power supply and having the other end connected to the main electrode of a corresponding one of the first and second controllable semiconductor devices; and a logic circuit operating under the DC power supply, wherein a pulse-like conduction signal is input to each of the control electrodes of the first and second controllable semiconductor devices with different timings so that the conduction through the controllable semiconductor devices causes a pulse-like voltage drop in the first and second load resistors, the voltage drop being then communicated to the logic circuit as a signal.

The level shift circuit preferably includes signal-disabling means for preventing a signal corresponding to a pulse-like voltage drop from being communicated to the logic circuit when the voltage drop simultaneously occurs in the first and second load resistors.

In a further embodiment, the signal-disabling means masks a signal corresponding to a voltage drop in the first load resistor and communicated to the logic circuit, using a masking signal generated based on a voltage drop in the second load resistor, while masking a signal corresponding to a voltage drop in the second load resistor and communicated to the logic circuit, using a masking signal generated based on a voltage drop in the first load resistor.

In a further embodiment, the signal-disabling means uses thresholds for detecting a voltage drop in the load resistors to generate pulses in such a manner that a threshold for use in generating (via NOT circuits) pulses for the signal communicated to the logic circuit differs from a threshold for use in generating (via NOT circuits) pulses for the masking signal, in order to carry out the masking so that the pulse width of the masking signal entirely covers the pulse width of the signal communicated to the logic circuit.

In an additional embodiment, the signal-disabling means delays a front edge of a raw pulse signal generated by detecting a voltage drop in said load resistor, in order to obtain the signal communicated to the logic circuit, and wherein the signal-disabling means delays a rear edge of the raw pulse signal to obtain the masking signal in order to carry out the masking.

In a still further embodiment, the signal-disabling means carries out the masking in such a manner that no difference in generation exists between the signal communicated to the logic circuit and the masking signal and removes signals that remain despite the masking, via a low-pass filter.

In addition, the level shift circuit preferably comprises one or more sets of the controllable semiconductor devices and load resistors, a pulse-like conduction signal being input to each of the control electrodes of the controllable semiconductor devices wherein a current negative feedback resistor is inserted between the potential reference electrode of each controllable semiconductor device and common potential so that the voltage between the control electrode and the common potential has a predetermined value smaller than the voltage value of the DC power supply while each controllable semiconductor device is conductive.

Still further, the circuit includes constant-voltage diodes for limiting the voltage between the control electrode of each controllable semiconductor device and the common potential to the predetermined value.

Other advantanges and features of the invention will become apparent from the following detailed description of the preferred embodiments of the invention and the accompanying drawings.

DETAILED DESCRIPTION OF THE PREFERRED EMBODIMENTS OF THE INVENTION

According to the invention for the first object (referred to as a "first invention" and related to Claims 1 to 5 and 8), a circuit is inserted into the level shift circuit for disabling, by determining that this signal is actually a noise rather than a regular on or off pulse, a signal input to the logic circuit (consisting of the RS latch 15 and other components) of the level shift-circuit and corresponding to a simultaneous voltage drop in the load resistors 3, 4 for the high-voltage MOSFETs 1, 2 which is associated with dV/dt at the AC output terminal OUT.

To disable the signal, two signals (a signal that can become a regular signal and a masking signal) are generated for each of the two load resistors based on the voltage drop in the load resistors so that the masking signal for one of the load resistors masks the signal for the other load resistor which can become a regular signal, whereas the signal for the first load resistor which can become a regular signal is masked by the masking signal for the second load resistor.

In addition, the invention for the second object (referred to as a "second invention" and related to Claims 6 and 7) improves the constant-current characteristic of a drain (or collector) current using a source follower (or emitter follower) connection in which a current negative-feedback resistor is inserted into a source (or emitter) of each of the MOSFETs 1, 2 (or bipolar transistors) for a level shift circuit. This invention also sets a voltage applied between a gate (or base) of each of these high-voltage transistors and the common potential equal to a value lower than the voltage value of the auxiliary power supply E1 which minimizes the power supply voltage for the load resistor circuit for the high-voltage transistors, in order to limit the drain current and to obtain a sufficient voltage drop in the load resistors 3, 4 based on this current.

Figure 1:
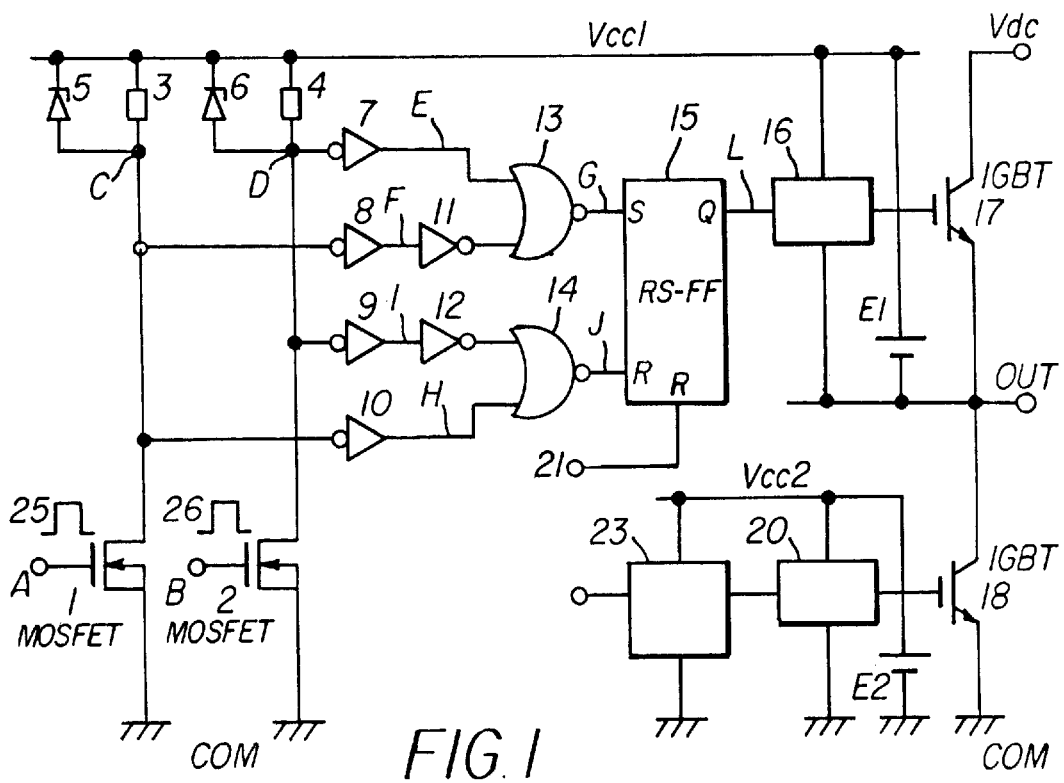
FIG. 1 is a circuit diagram showing a configuration of essential parts of a level shift circuit as a first example of a first invention.
Figure 7:
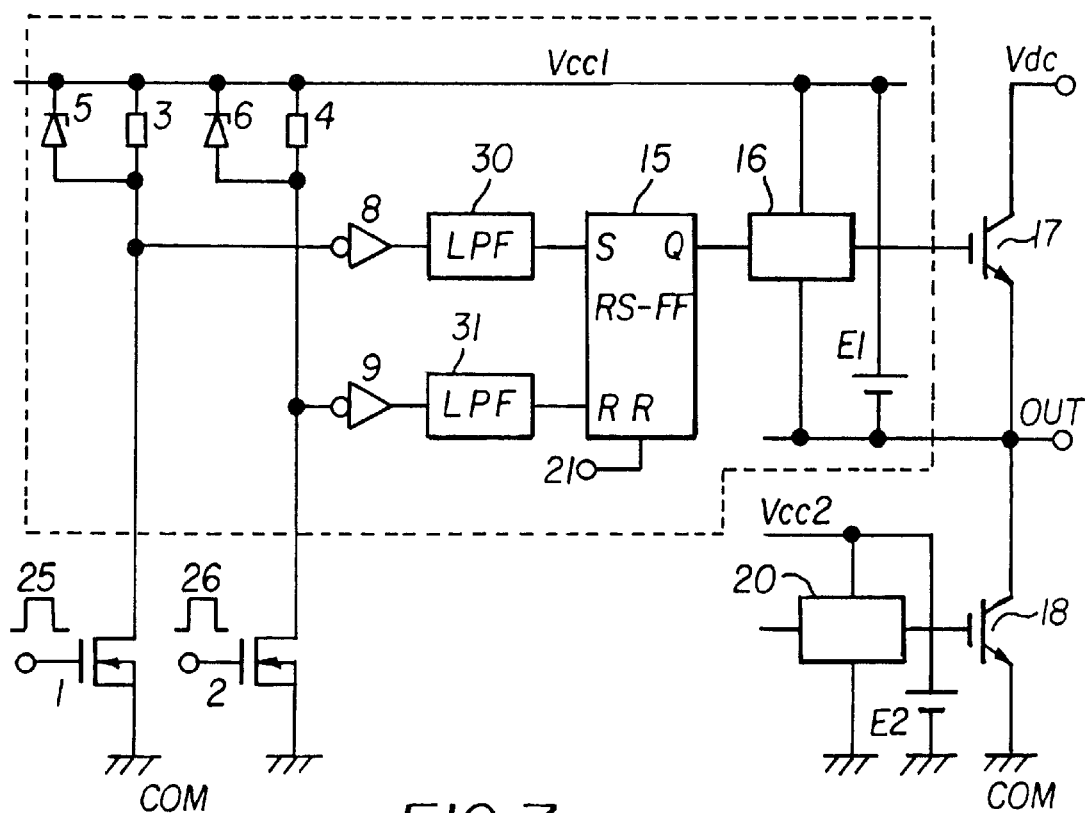
FIG. 7 is a circuit diagram showing an example of a configuration of a conventional level shift circuit.

FIG. 1 is a circuit diagram showing a configuration provided as a first example of the first invention for attaining the first object. This FIG. is the same as FIG. 7 with two exceptions: in addition to NOT circuits 8, 9, NOT circuits 7, 10, 11, 12 and NOR circuits 13, 14 are connected to the level shift circuit; and the low-pass filter is omitted.

A set of the NOT circuits 7, 8, 11 and the NOR circuit 13 and a set of the NOT circuits 9, 10, 12 and the NOR circuit 14 are configured to be laterally symmetrical relative to a MOSFET 1 (left) and a MOSFET 2 (right).

A threshold for the NOT circuits 8, 9 is set lower than a threshold for the NOT circuits 7, 10.

Figure 2:
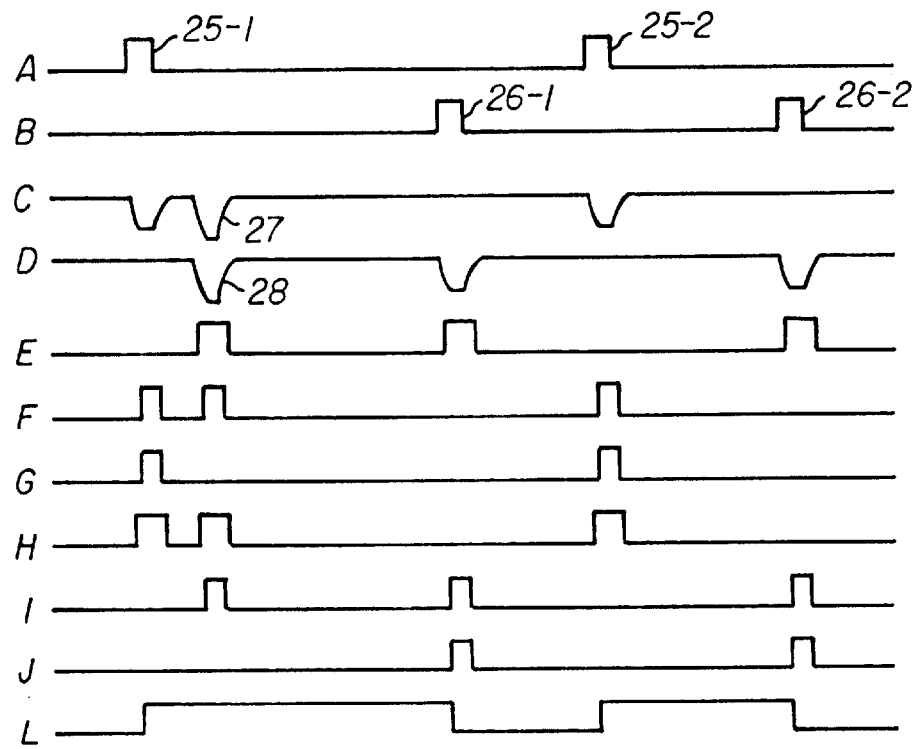
FIG. 2 is a waveform diagram of each section of the level shift circuit in FIG. 1.

A to L in FIG. 2 each indicate the timing and waveform of a signal at a corresponding one of the points A to L shown in FIG. 1. Next, operation of the circuit in FIG. 1 will be described with reference to the waveform diagram in FIG. 2.

An on signal 25-1 input to a gate (a point A) of the MOSFET 1 causes a current to flow through the MOSFET 1 to reduce the potential at a lower end (a point C) of a load resistor 3 relative to a positive-electrode line Vcc1 of an auxiliary DC power supply E1. The waveform at the point C is obtained by inverting and rounding the waveform at the point A. This rounding depends on the input capacity of the NOT circuit 8.

On the other hand, at this point of time, no off signal is input to a gate (a point B) of the MOSFET 2, whereby no signal is input to a lower end (a point D) of a load resistor 4. Thus, an output (a point E) of the NOT circuit 7 is fixed at a Lo level, and a signal (Lo) at the point C is output from the NOT circuit 8; the output signal has a pulse width determined by a threshold for the NOT circuit 8 and also has the Hi waveform shown at a point F. The output signal is transmitted to an output (a point G) of the NOR circuit 13 via the NOT circuit 11 as a Hi signal. Then, the signal works as a set signal for a RS latch 15. Accordingly, an output (a point L) of the RS latch 15 is set to a Hi level to turn an output IGBT 17 on.

Similarly to the on signal 25-1, an off signal 26-1 to the gate (the point B) of the MOSFET 2 changes to a signal (Lo) at the point D. Then, this signal is output from the NOT circuit 9; the output signal has a pulse width determined by a threshold for the NOT circuit 9 and also has the Hi waveform shown at a point I. The signal is then transmitted to an output (a point J) of the NOR circuit 14 via the NOT circuit 12 so as to work as a reset signal for the RS latch 15. Accordingly, the output (the point L) of the RS latch 15 is reset to turn the output IGBT 17 off.

Consider switching such that the IGBT 18 is turned off from on, while the IGBT 17 is turned on from off. This switching of the IGBT 17 causes a positive dV/dt to be applied to the AC output terminal OUT. This dV/dt allows a current to flow through the load resistors 3 and 4 to charge a capacitance between a source and a drain of each of the high-voltage MOSFETs 1 and 2.

In this case, since the high-voltage MOSFETs 1 and 2 are generally comprised of elements of the same size, an almost equal current charges the capacitance between the source and drain of each of the high-voltage MOSFETs 1 and 2. Consequently, waveforms appearing at the points C and D in FIG. 2 have an almost equal timing and size as shown by noise signals 27 and 28.

Thus, at this point in time, the NOT circuits 7 to 10 each output a signal with a pulse width corresponding to the threshold input to that NOT circuit.

Since the NOT circuit 7 has a higher input threshold than the NOT circuit 8, all output pulses from the NOT circuit 8 (the waveform at the point F) are contained within the range of the width of output pulses from the NOT circuit 7 (the waveform at the point E).

Consequently, by masking an inverted output from the NOT circuit 8 (an output from the NOT circuit 11) with an output from NOT circuit 7 via the NOR circuit 13, the noise signal 27 is prevented from being transmitted to the set input (the point G) of the RS latch 15.

Likewise, the NOT circuit 10 has a higher input threshold than the NOT circuit 9, so that by masking an inversion (an output from the NOT circuit 12) of an output from the NOT circuit 9 (the waveform at the point 1) with an output from NOT circuit 10 (the waveform at the point H) via the NOR circuit 14, the noise signal 28 is prevented from being transmitted to the reset input (the point J) of the RS latch 15.

In this manner, by disabling, as noise, a pulse signal such as noise associated with dV/dt that simultaneously appears in the load resistors 3 and 4 for the MOSFETs 1 and 2, the RS latch 15 and thus the output IGBT 17 can be prevented from malfunctioning.

Reference numeral 23 in FIG. 1 denotes a delay circuit for allowing the IGBT 18 side to correct delayed switching of the IGBT 17 caused by a delay time in the level shift circuit. The delay circuit 23 delays a signal that is input to a driver 20 from a circuit (not shown) to turn on or off the IGBT 18.

Compared to the conventional level shift circuit using a low-pass filter, this embodiment can reduce the delay time in the level shift circuit, the capacity required for the delay circuit 23, and the area of a relevant IC chip.

Figure 3:
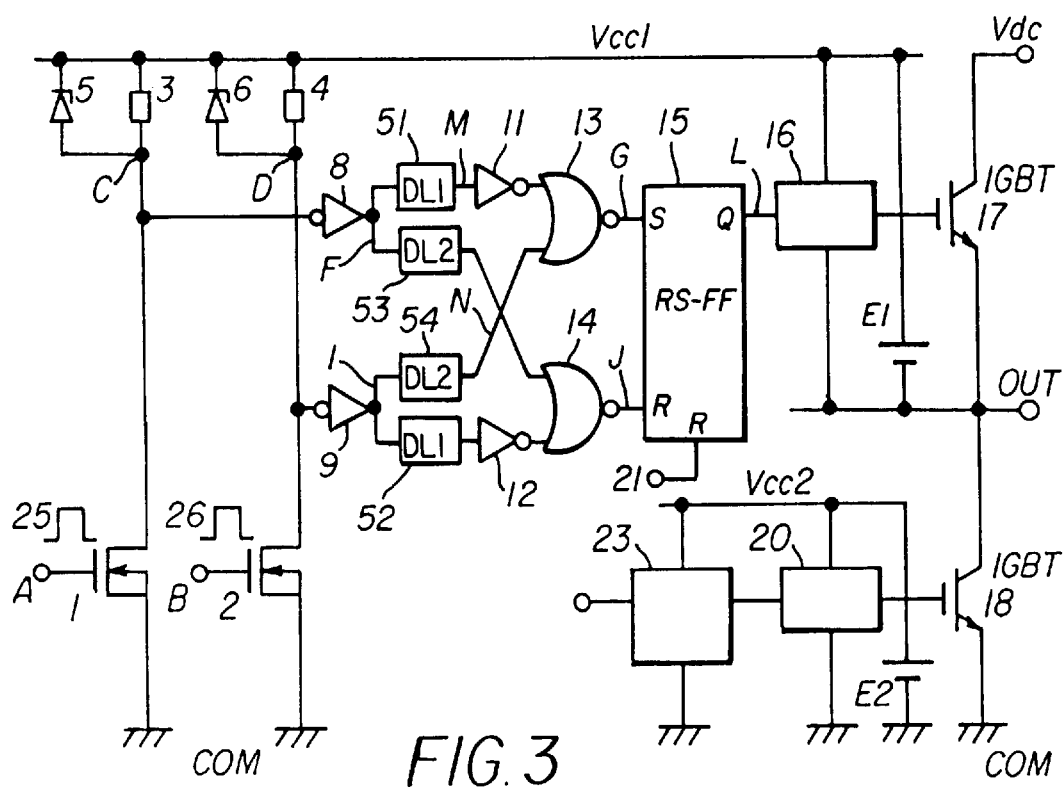
FIG. 3 is a circuit diagram showing a configuration of essential parts of a level shift circuit as a second example of the first invention.
Figure 4:
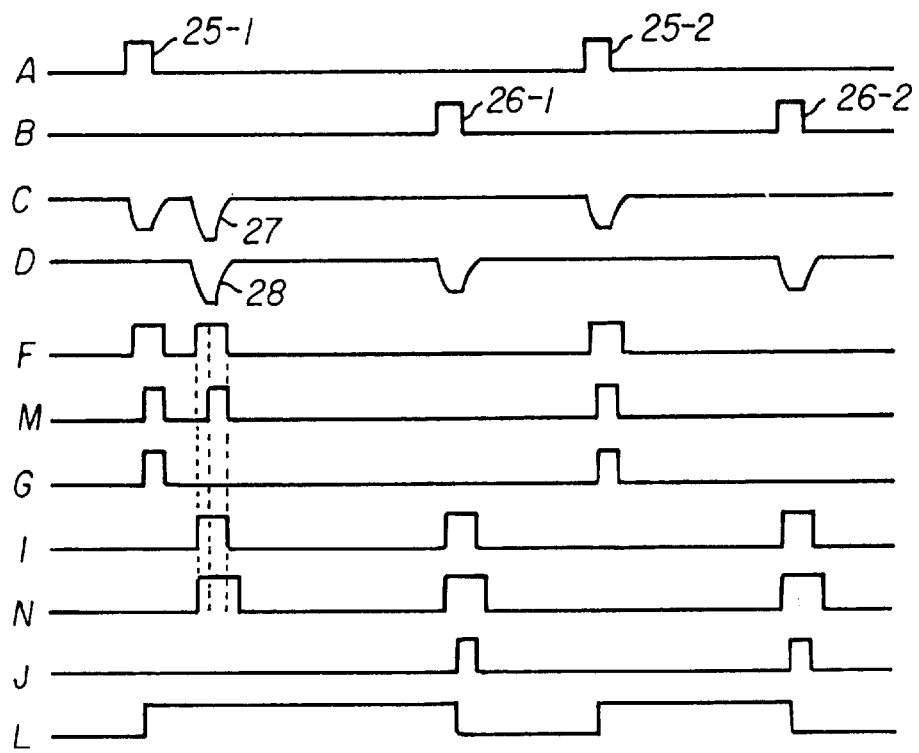
FIG. 4 is a waveform diagram of each section of the level shift circuit in FIG. 3.

FIG. 3 shows a configuration of essential parts of a second example of the first invention, and FIG. 4 shows the timing and waveforms of signals obtained at the points A to D, F, M, G, I, N, J, L in FIG. 3.

In FIG. 3, the NOT circuits 7, 10 in FIG. 1 are omitted, and only the NOT circuits 8, 9 having the same threshold are connected to the lower ends of the load resistors 3, 4, that is, the points C and D, respectively. In addition, newly provided front-edge delay circuits (also simply referred to as "DL Is") 51 and 52 are inserted between the NOT circuits 8 and 11 and between the NOT circuits 9 and 12, respectively. Further, also newly provided rear-edge delay circuits (also simply referred to as "DL2s"). 53 and 54 are inserted between an output of the NOT circuit 8 and an idle input of the NOR circuit 14 and between an output of the NOT circuit 9 and an idle input of the NOR circuit 13, respectively.

As shown in FIG. 4, noise signals 27, 28 simultaneously appearing at the points C and D cause the NOT circuits 8, 9 to output Hi pulses of the same waveform to the output points F, I, respectively.

The waveform at the point F has its front edge cut by the front-edge delay circuit 51 and thus becomes the one shown at the point M, which is then inverted through the NOT circuit 11 and delivered to one of the inputs of the NOR circuit 13. The other input to the NOR circuit 13, however, is the waveform shown at the point N, which is obtained by using the rear-edge delay circuit 54 to extend a rear edge of the waveform at the point I.

Thus, the inverted waveform Lo at the point M output from the NOT circuit 11 is masked by the waveform Hi at the point N and does not appear at the set input (the point G) of the RS latch 15.

Likewise, although not shown, a signal input to the NOR circuit 14 from the point I through the front-edge delay circuit 52 and the NOT circuit 12 is masked by a signal input to the NOR circuit 14 from the point F through the rear-edge delay circuit 53, and does not appear at the reset input (the point J) of the RS latch 15.

In addition to the above examples, various methods may be contemplated that mask pulse signals simultaneously appearing in the load resistors 3 and 4: replacing the NOT circuits 7, 10 and 8, 9 in FIG. 1 with comparators having different reference potentials; using an identical threshold for the NOT circuits 7, 8, 9, 10, allowing outputs from the NOT circuits 7 and 8 to mask each other while allowing outputs from the NOT circuits 9 and 10 to mask each other, and removing short pulses remaining despite masking, using a low-pass filter having a sufficiently high cutoff frequency; or omitting the delay circuits 51 to 54 in FIG. 3 to obtain connections with this delay circuit section short circuited and removing short pulses output from the NOR circuits 13, 14 despite masking, using a low-pass filter having a sufficiently high cutoff frequency.

Figure 5:
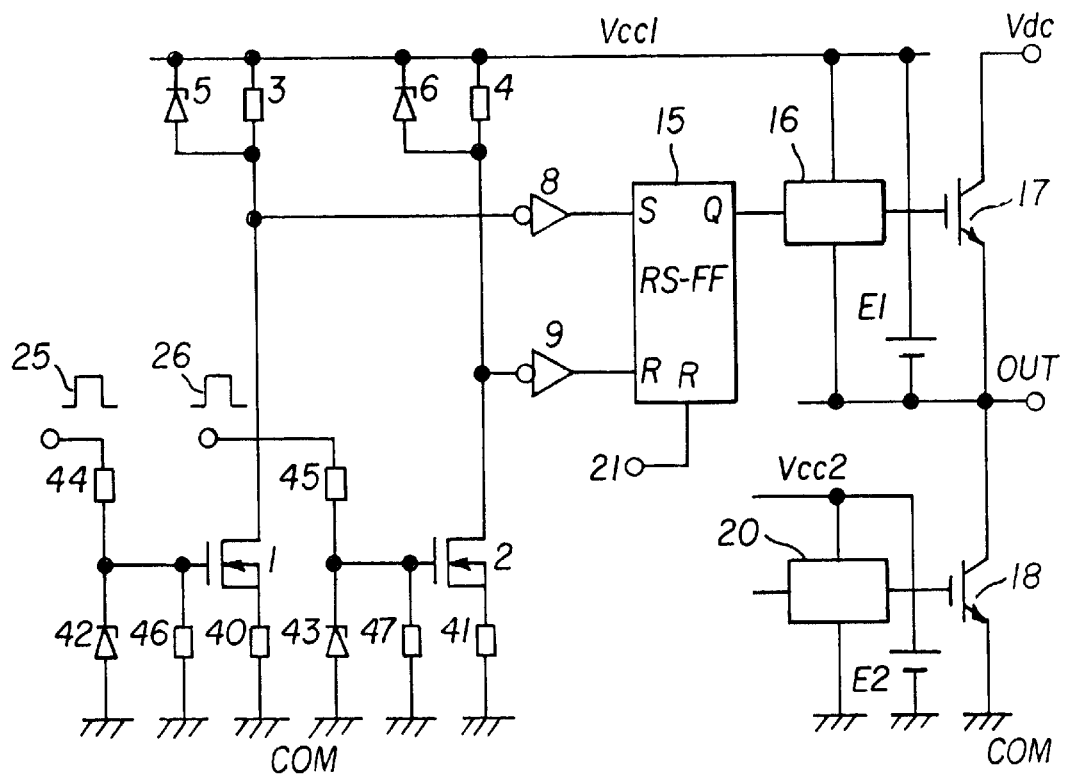
FIG. 5 is a circuit diagram showing a configuration of essential parts of a level shift circuit as an example of a second invention.

FIG. 5 is a circuit diagram showing a configuration provided as an example of the second invention for attaining the second object. This FIG. differs from FIG. 7 for a conventional circuit in that current negative feedback resistors 40, 41 are connected between the sources of the high-voltage MOSFETs 1, 2 and the common potential COM, respectively, to constitute a source follower connection and in that constant-voltage diodes 42, 43, resistors 44, 45, and resistors 46, 47 are connected to the gates of the high-voltage MOSFETs 1, 2, respectively.

In this example, the auxiliary DC power supply E1 has a voltage of 15 V, and the constant-voltage diodes 42, 43 have a Zener voltage of about 5 to 7 V. In addition, circuits for generating the on signal 25 and the off signal 26 to drive the gates of the high-voltage MOSFETS 1, 2, respectively, share an auxiliary DC power supply E2 (15 V) that uses the common potential COM as a negative electrode. A pulse signal of about 15 V is input to each of the input terminals (the upper ends of the resistors 44, 45) for the on signal 25 and the off signal 26.

Figure 6:
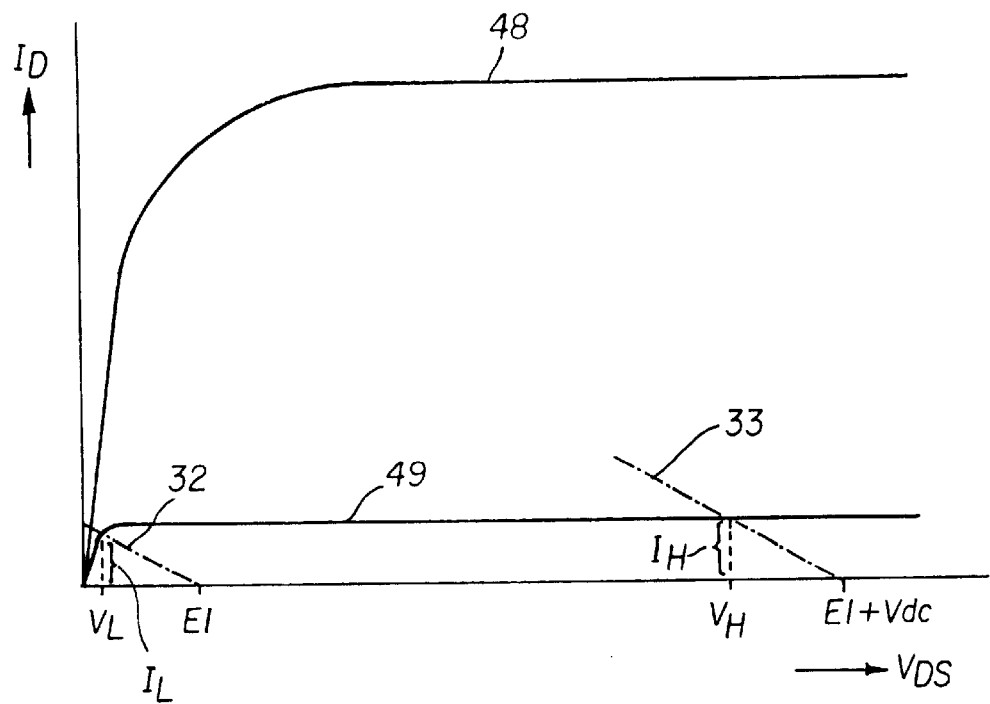
FIG. 6 is a characteristic diagram for describing operation of the level shift circuit in FIG. 5.

FIG. 6 is a characteristic diagram for describing operation of the circuit in FIG. 5. Reference numeral 48 denotes a $V_{DS}$-$I_D$ characteristic of each of the high-voltage MOSFETs 1, 2, and 49 is a $V_{DS}$-$I_D$ characteristic shown when the feedback resistors 40, 41 are inserted into the circuit.

Figure 8:
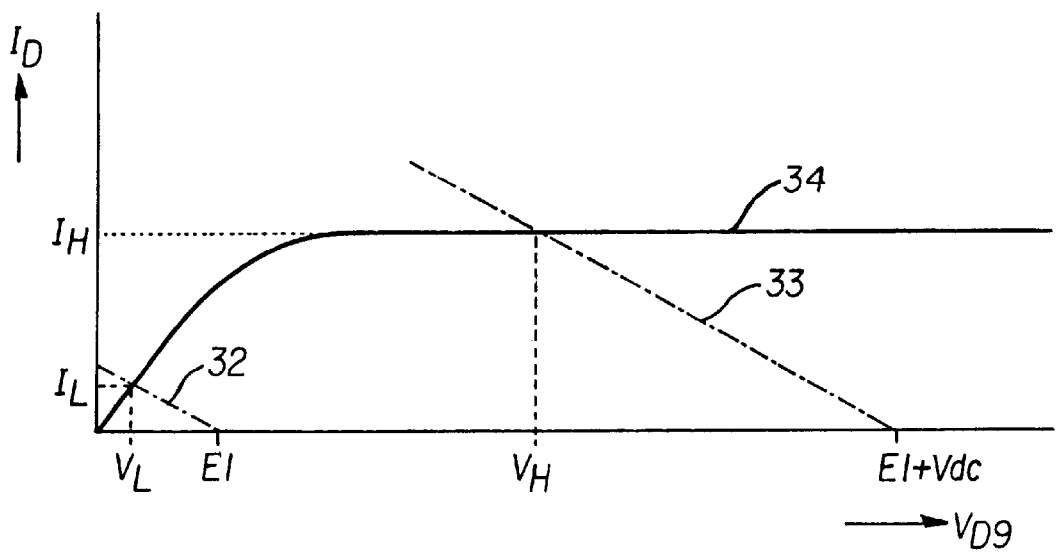
FIG. 8 is a characteristic diagram for describing problems of conventional level shift circuits.

Compared to the conventional $V_{DS}$-$I_D$ characteristic 34 shown in FIG. 8, the $V_{DS}$-$I_D$ characteristic 48 has a larger designed absolute value of the drain current $I_D$ but almost the same range of $V_{DS}$ indicating a constant current. This characteristic can be implemented by increasing the channel lengths of the high-voltage MOSFETs 1, 2.

As shown in FIG. 5, if the feedback resistors 40, 41 are inserted between the sources of the high-voltage MOSFETs 1, 2 and the common potential COM, respectively, and the gate voltages of the high-voltage MOSFETs 1, 2 are clamped by the constant-voltage diodes 42, 43 and when the MOSFETs 1, 2 become conductive due to the input of the on signal 25 and the off signal 26 to the resistors 45, 45, respectively.

The drain current ID induces a voltage drop in the feedback resistors 40, 41 to reduce the voltage between the gate and source of each of the high-voltage MOSFETs 1, 2, whereby the voltage drop in the feedback resistors 40, 41 cannot exceed the gate voltage (that is, the Zener voltage of a corresponding one of the constant-voltage diodes 42, 43) minus the gate threshold (about 0.5 to 2 V) for a corresponding one of the high-voltage MOSFETs 1, 2.

Consequently, negative feedback is applied to the drain current $I_D$ to provide a characteristic with a large constant-current range such as one shown at 49 in FIG. 6. This configuration can reduce a difference between drain currents $I_H$ and $I_L$ that depends on the magnitude of the potential of the AC output terminal OUT and that is a problem of the conventional level shift circuit. As a result, this configuration eliminates the needs for an excessive current.

Although in FIG. 5, the gate voltages of the high-voltage MOSFETs 1, 2 are clamped by the constant-voltage diodes 42, 43, the constant-voltage diodes may be omitted and instead the driver power supply E2, that is, a gate drive power supply for the high-voltage MOSFETs 1, 2 may be replaced with a power supply for a lower voltage of about 5 to 7 V.

Although the example in FIG. 5 shows two sets of the high-voltage MOSFETs and the load resistors therefor, the second invention is not limited to the output IGBT in an inverter bridge circuit but is applicable to signal transmissions to various other circuits with a varying potential relative to a ground potential, and one or more sets of the high-voltage MOSFETs and the load resistors may be used.

The present invention provides a level circuit wherein in order to transmit a drive signal generated on the common potential COM side to a semiconductor switching device such as an IGBT without potential insulation to turn the device on and off, the semiconductor switching device having an emitter potential varying relative to the common potential COM and constituting an upper arm of a PWM inverter bridge circuit. A logic circuit such as the RS latch 15 that operates under the auxiliary DC power supply (drive power supply) E1 connected to the potential-varying emitter (AC output terminal OUT) of the semiconductor switching device, for generating a signal for directly driving the device receives: the on signal 25 and the off signal 26 from the high-voltage transistors 1, 2, the signals each consisting of pulses and corresponding to a voltage drop in the load resistors 3, 4, the high-voltage transistors 1, 2 having, as loads, the resistors 3, 4 each having one end connected to the positive electrode of the auxiliary DC power supply E1, the high-voltage transistors 1, 2 having its source (or emitter) connected to the common potential COM.

According to a first aspect of the invention, a signal corresponding to a voltage drop simultaneously occurring in the load resistors 3, 4 are disabled as noise by using a masking signal for one of the two resistors 3, 4 (a signal that can become a regular signal and a masking signal are generated for each resistor) to mask the signal for the other resistor that can become a regular signal, wherein the voltage drop is induced by a charge current flowing from the two load resistors 3, 4 to the capacitance between the source and drain of each of the high-voltage transistors 1, 2 based on dV/dt at the AC output terminal OUT. Thus, such a signal is prevented from being transmitted to the logic circuit.

Consequently, the logic circuit can be prevented from malfunctioning irrespective of the temporal width of noise pulses, and the needs for a conventional low-pass filter are eliminated, thereby enabling the reduction of a delay time in the level shift circuit. Furthermore, this configuration further eliminates the need to distinguish the on/off signals input by the high-voltage transistors from noise signals by increasing the pulse width of the on/off signals. As a result, power consumption can be reduced.

In addition, according to a second aspect of the invention, the current negative-feedback resistor is inserted into the source (or emitter) of each of the high-voltage transistors for the level shift circuit to constitute a source follower (or emitter follower) connection, and the voltage applied between the gate (or base) of the high-voltage transistor and the common potential COM is set lower than the voltage of the auxiliary power supply E1 so as to minimize the load-resistor-side power supply voltage for the high-voltage transistor.

Consequently, the constant-current characteristic of the high-voltage transistor is improved, and the voltage drop in the current negative feedback resistor connected to the source (or emitter) can be reduced. As a result, a small and constant drain (or collector) current is allowed to flow regardless of the voltage between the drain and source (or collector and emitter) of the high-voltage transistor, and stable signals can be transmitted while maintaining an appropriate voltage drop in the load resistors irrespective of the potential of the circuit section with a varying potential. In addition, the power consumption of the level shift circuit can be reduced.

What is claimed is:

1. A level shift circuit comprising:
   at least one controllable semiconductor device including an electrode acting as a potential reference and connected to a common potential, the potential reference electrode and a main electrode being electrically connected together while a conduction signal is being input between the potential reference electrode and a control electrode;

a DC power supply having one electrode connected to an external circuit at its predetermined site varying between the common potential and a predetermined high potential, the DC power supply having a voltage lower than a voltage between said two potentials;

at least one load resistor having one end connected to the other electrode of the DC power supply and having the other end connected to the main electrode of said controllable semiconductor device; and a logic circuit operating under said DC power supply, wherein a pulse-like conduction signal is input to the control electrode of said controllable semiconductor device so that conduction through the controllable semiconductor device causes a pulse-like voltage drop in the load resistor, the voltage drop being then communicated to said logic circuit as a signal, and wherein a current negative feedback resistor is inserted between the potential reference electrode of the controllable semiconductor device and the common potential so that the voltage between the control electrode and the common potential has a predetermined value smaller than the voltage value of said DC power supply while each controllable semiconductor device is conductive.

2. A level shift circuit according to claim 1, wherein the circuit includes at least one constant-voltage diode for limiting the voltage between the control electrode of the controllable semiconductor device and the common potential to said predetermined value.

* * * * *